United States Patent
Tak et al.

(10) Patent No.: US 11,569,417 B2
(45) Date of Patent: Jan. 31, 2023

(54) METHOD OF MANUFACTURING SEMICONDUCTOR LIGHT EMITTING DEVICE

(71) Applicant: SAMSUNG ELECTRONICS CO., LTD., Suwon-si (KR)

(72) Inventors: Young Jo Tak, Seongnam-si (KR); Joo Sung Kim, Seongnam-si (KR); Jong Uk Seo, Hwaseong-si (KR); Dong Gun Lee, Hwaseong-si (KR); Yong Il Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/720,923

(22) Filed: Apr. 14, 2022

(65) Prior Publication Data
US 2022/0246803 A1 Aug. 4, 2022

Related U.S. Application Data

(62) Division of application No. 16/571,741, filed on Sep. 16, 2019, now abandoned.

(30) Foreign Application Priority Data

Mar. 18, 2019 (KR) ........................ 10-2019-0030722

(51) Int. Cl.
*H01L 33/38* (2010.01)
*H01L 33/62* (2010.01)
(Continued)

(52) U.S. Cl.
CPC ........ *H01L 33/382* (2013.01); *H01L 25/0753* (2013.01); *H01L 33/385* (2013.01);
(Continued)

(58) Field of Classification Search
CPC combination set(s) only.
See application file for complete search history.

(56) References Cited

U.S. PATENT DOCUMENTS 5,999,553 A 12/1999 Sun
6,372,608 B1 4/2002 Shimoda et al.
(Continued)

FOREIGN PATENT DOCUMENTS

DE 102010044559 A1 7/2011

OTHER PUBLICATIONS

H. Kim et al., "Suppression of Leakage Current in InGaN/GaN Multiple-Quantum Well LEDs by $N_2O$ Plasma Treatment", Electrochemical and Solid-State Letters, 7 (11), pp. G241-G243, 2004.
(Continued)

*Primary Examiner* — Moin M Rahman
*Assistant Examiner* — Mohammad A Rahman
(74) *Attorney, Agent, or Firm* — Lee IP Law, P.C.

(57) ABSTRACT

A method of manufacturing a semiconductor light emitting device, the method including forming a first conductivity-type semiconductor layer on a substrate; forming an active layer on the first conductivity-type semiconductor layer; forming a mask layer having an opening on the active layer; growing a second conductivity-type semiconductor layer through the opening; removing the mask layer; removing a portion of the active layer and a portion of the first conductivity-type semiconductor layer that do not overlap the second conductivity-type semiconductor layer; and removing a portion of the first conductivity-type semiconductor layer to expose the substrate.

20 Claims, 13 Drawing Sheets

(51) Int. Cl.
  *H01L 25/075* (2006.01)
  *H01L 33/52* (2010.01)
(52) U.S. Cl.
  CPC .............. *H01L 33/52* (2013.01); *H01L 33/62* (2013.01); *H01L 2933/005* (2013.01)

(56) References Cited

U.S. PATENT DOCUMENTS

| | | |
|---|---|---|
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,476,903 B2 | 1/2009 | Murayama |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 9,318,656 B2 | 4/2016 | Aihara |
| 9,484,492 B2 | 11/2016 | Bour et al. |
| 9,865,775 B2 | 1/2018 | Suh et al. |
| 2002/0030195 A1 | 3/2002 | Yoshii et al. |
| 2003/0138981 A1 | 7/2003 | Yamaguchi et al. |
| 2007/0284593 A1 | 12/2007 | Ko et al. |
| 2009/0261318 A1 | 10/2009 | Cheong |
| 2011/0062457 A1 | 3/2011 | Naito et al. |
| 2013/0146842 A1 | 6/2013 | Kim et al. |
| 2013/0240932 A1 | 9/2013 | Tu et al. |
| 2013/0313587 A1 | 11/2013 | Lin et al. |
| 2014/0048839 A1 | 2/2014 | Jeong et al. |
| 2014/0241391 A1 | 8/2014 | Abe |
| 2016/0197232 A1 | 7/2016 | Bour et al. |
| 2017/0062680 A1 | 3/2017 | Yoo et al. |
| 2017/0186810 A1* | 6/2017 | Lee ................. H01L 33/24 |
| 2017/0317236 A1 | 11/2017 | Lee et al. |
| 2018/0351042 A1 | 12/2018 | Jang et al. |

OTHER PUBLICATIONS

C. Zhao et al., "An enhanced surface passivation effect in InGaN/GaN disk-in-nanowire light emitting diodes for mitigating Shockley-Read-Hall recombination", Nanoscale, 7, pp. 16658-16665, 2015.
Hyuck Soo Yang, et al. "Comparison of Surface Passivation Layers on InGaN/GaN MQW LEDs", Journal of Semiconductor Technology and Science, Jun. 2005.
Sergey Yu. Karpov, "From Large-Size to Micro-LEDs: Scaling Trends Revealed by Modeling", physica status solidi (a), Dec. 2017.
Matthew Wong, et al. "High efficiency of 111-nitride micro-light-emitting diodes by sidewall passivation using atomic layer deposition", Optics Express, Aug. 2018.
German Office action dated Nov. 4, 2022.

* cited by examiner

METHOD OF MANUFACTURING SEMICONDUCTOR LIGHT EMITTING DEVICE

CROSS-REFERENCE TO RELATED APPLICATIONS

This is a continuation application based on application Ser. No. 16/571,741, filed Sep. 16, 2019, the entire contents of which is hereby incorporated by reference.

Korean Patent Application No. 10-2019-0030722, filed on Mar. 18, 2019, in the Korean Intellectual Property Office, and entitled: "Semiconductor Light Emitting Device and Method of Manufacturing the Same," is incorporated by reference herein in its entirety.

BACKGROUND

1. Field

Example embodiments relate to a semiconductor light emitting device and a method of manufacturing the same.

2. Description of the Related Art

A semiconductor light emitting device has a long lifespan, low power consumption, high response speeds, eco-friendliness, and the like, and has been considered as an important light source in a variety of products, e.g., a lighting device, a display device, and the like. A general display device includes a display panel including a liquid crystal display (LCD) and a backlight including a semiconductor light emitting device. Recently, a display device has been designed to use semiconductor light emitting devices as pixels that does not require a backlight.

SUMMARY

According to an example embodiment, a semiconductor light emitting device includes a first conductivity-type semiconductor layer; an active layer covering a portion of the first conductivity-type semiconductor layer; and a second conductivity-type semiconductor layer covering a portion of the active layer. Sidewalls of the second conductivity-type semiconductor layer are spaced apart from sidewalls of the active layer along a horizontal direction.

According to an example embodiment, a semiconductor light emitting device includes a first conductivity-type semiconductor layer; an active layer on the first conductivity-type semiconductor layer; and a second conductivity-type semiconductor layer on the active layer. A surface area of a lower surface of the second conductivity-type semiconductor layer is smaller than a surface area of an upper surface of the active layer.

According to an example embodiment, a method of manufacturing a semiconductor light emitting device includes forming a first conductivity-type semiconductor layer on a substrate; forming an active layer on the first conductivity-type semiconductor layer; forming a second conductivity-type semiconductor layer on a portion of the active layer; removing a portion of the active layer and a portion of the first conductivity-type semiconductor layer not overlapping with the second conductivity-type semiconductor layer; and removing a portion of the first conductivity-type semiconductor layer to expose the substrate.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
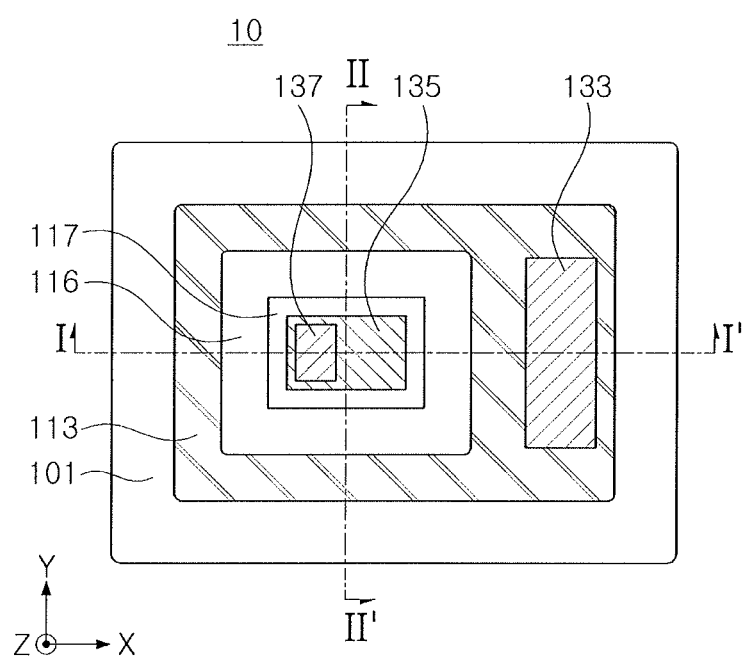
FIG. 1 illustrates a plan diagram a semiconductor light emitting device according to an example embodiment.
Figure 2:
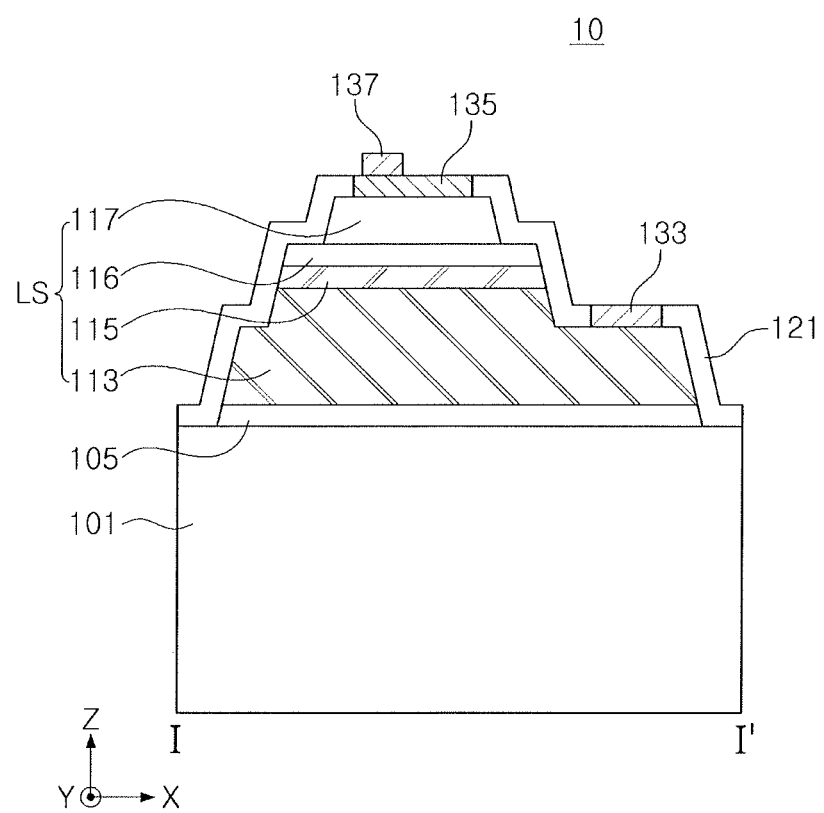
FIGS. 2 and 3 illustrate cross-sectional diagrams taken long lines I-I' and II-IF in FIG. 1 according to an example embodiment.
Figure 3:
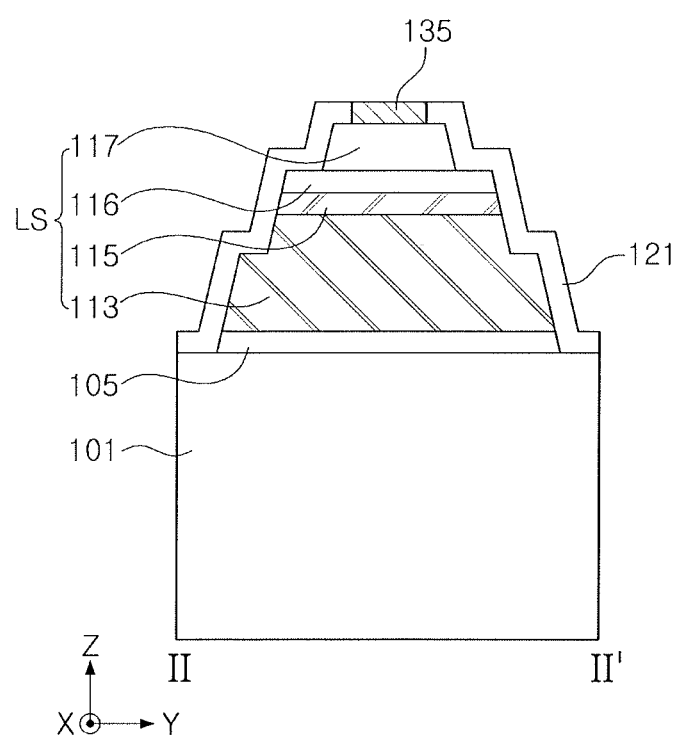

FIG. 1 illustrates a plan diagram of a semiconductor light emitting device according to an example embodiment. FIGS. 2 and 3 are cross-sectional diagrams taken long lines I-I' and II-II' in FIG. 1 according to an example embodiment.

Referring to FIGS. 1 to 3, a semiconductor light emitting device 10 in the example embodiment may include a light emitting structure LS on a substrate 101. The light emitting structure LS may include a first conductivity-type semiconductor layer 113, an active layer 115, a capping layer 116, and a second conductivity-type semiconductor layer 117. A first electrode 133 and a second electrode 137 may be on the first conductivity-type semiconductor layer 113 and the second conductivity-type semiconductor layer 117, respectively. The semiconductor light emitting device 10 may have a size of several to several hundreds of μm.

The substrate 101 may be an insulating substrate, e.g., sapphire. In an implementation, the substrate 101 may also be a conductive substrate or a semiconductor substrate. For example, the substrate 101 may be one of SiC, Si, $MgAl_2O_4$, MgO, $LiAlO_2$, $LiGaO_2$, GaN, and the like. The substrate 101 may include a plurality of serrated structures that may improve emitting efficiency of the semiconductor light emitting device 10.

A buffer layer 105 may be between the substrate 101 and the first conductivity-type semiconductor layer 113. The buffer layer 105 may be $In_xAl_yGa_{1-x-y}N$ (0≤x≤1, 0≤y≤1). For example, the buffer layer 105 may be formed of GaN, AlN, AlGaN, InGaN, alloys thereof, and the like. The buffer layer 105 may have a structure in which a plurality of distinct layers are combined or a structure in which a composition gradually changes. The buffer layer 105 may reduce a difference in lattice constants between the substrate 101 and the first conductivity-type semiconductor layer 113 such that a lattice defect of the first conductivity-type semiconductor layer 113 may be reduced The first conductivity-type semiconductor layer 113 may have a nitride semiconductor layer satisfying $In_xAl_yGa_{1-x-y}N$ (0≤x<1, 0≤y<1, 0≤x+y<1). The first conductivity-type semiconductor layer 113 may include n-type impurities (dopant). For example, the first conductivity-type semiconductor layer 113 may include n-type GaN. As an example, the first conductivity-type semiconductor layer 113 may be implemented as a single layer structure, but may also have a multilayer structure including layers having different compositions.

The active layer 115 may have a multi-quantum-well MQW structure in which a quantum well layer and a quantum barrier layer are alternately layered. For example, the quantum well layer and the quantum barrier layer may be $In_xAl_yGa_{1-x-y}N$ (0≤x<1, 0≤y<1, 0≤x+y<1), and compositions thereof may be different from each other. For example, the quantum well layer may be $In_xGa_{1-x}N$ (0<x≤1), and the quantum barrier layer may be GaN or AlGaN. Thicknesses of the quantum well layer and the quantum barrier layer may be within a range of 1 nm to 50 nm. In an implementation, the active layer 115 may be a single quantum well structure.

The capping layer 116 between the second conductivity-type semiconductor layer 117 and the active layer 115 may be a single layer or may be a multilayer structure in which a plurality of layers having different compositions are layered. The capping layer 116 may include a nitride semiconductor satisfying $In_xAl_yGa_{(1-x-y)}N$ (0≤x≤1, 0≤y≤1, 0≤x+y≤1). An energy band gap of the capping layer 116 may be greater than an energy band gap of the active layer 115. A portion of the capping layer 116, a region adjacent to the second conductivity-type semiconductor layer 117, may include the second conductivity-type impurities (dopant) diffused from the second conductivity-type semiconductor layer 117.

The second conductivity-type semiconductor layer 117 may be a nitride semiconductor layer satisfying $In_xAl_yGa_{1-x-y}N$ (0≤x<1, 0≤y<1, 0≤x+y<1). The second conductivity-type semiconductor layer 117 may include p-type impurities (dopant). For example, the second conductivity-type semiconductor layer 117 may include p-type GaN. As an example, the second conductivity-type semiconductor layer 117 may be implemented as a single layer structure or may have a multilayer structure including layers having different compositions.

In an implementation, the first conductivity-type semiconductor layer 113 may be a nitride semiconductor layer satisfying p-type $In_xAl_yGa_{1-x-y}N$ (0≤x<1, 0≤y<1, 0≤x+y<1), and the second conductivity-type semiconductor layer 117 may be a nitride semiconductor layer satisfying n-type $In_xAl_yGa_{1-x-y}N$ (0≤x<1, 0≤y<1, 0≤x+y<1).

The active layer 115 may be formed on a portion of the first conductivity-type semiconductor layer 113, e.g., sidewalls of the active layer 115 may be coplanar with sidewalls of an upper surface of the first conductivity-type semiconductor layer 113, while a lower surface of the first conductivity-type semiconductor layer 113 may extend beyond the active layer 115 along a horizontal direction parallel to an upper surface of the substrate 101, e.g., a first direction (e.g., X direction) and a second direction (e.g., Y direction). The capping layer 116 may cover an overall upper surface of the active layer 115, and sidewalls of the capping layer 116 may be coplanar with sidewalls of the active layer 115.

The second conductivity-type semiconductor layer 117 may be formed on a portion of the capping layer 116. Sidewalls of the second conductivity-type semiconductor layer 117 may not be coplanar with sidewalls of the capping layer 116 and the active layer 115. In particular, sidewalls of the second conductivity-type semiconductor layer 117 may be spaced apart from sidewalls of the active layer 115 and sidewalls of the capping layer 116 along a horizontal direction parallel to the upper surface of the substrate 101, e.g., the first direction (e.g., X direction) and the second direction (e.g., Y direction). Widths of the second conductivity-type semiconductor layer 117 taken in the first direction (e.g., X direction) and the second direction (e.g., Y direction) may be smaller than widths of the capping layer 116 and widths of the active layer 115. For example, widths of a lower surface of the second conductivity-type semiconductor layer 117 taken in the first direction (e.g., X direction) and the second direction (e.g., Y direction) may be smaller than widths of an upper surface of the capping layer 116 and widths of an upper surface of the active layer 115. A surface area of the second conductivity-type semiconductor layer 117 may be smaller than a surface area of the capping layer 116 and an area of the active layer 115. For example, the surface area of a lower surface of the second conductivity-type semiconductor layer 117 may be smaller than the surface area of an upper surface of the capping layer 116 and the surface area of an upper surface of the active layer 115.

As described above, by distancing sidewalls of the second conductivity-type semiconductor layer 117 from sidewalls of the active layer 115, which may be a cause of non-luminous coupling, and by configuring an area of the second conductivity-type semiconductor layer 117 to be smaller than an area of the active layer 115, current density may increase and a light emitting efficiency may improve, even when the semiconductor light emitting device 10 operates at low voltage.

The first electrode 133 may be on, e.g., directly on, the first conductivity-type semiconductor layer 113. For example, the first electrode 133 may be spaced apart from the active layer 115 along a horizontal direction parallel to the upper surface of the substrate 101, e.g., the first direction (e.g., X direction). The second electrode 137 is on the second conductivity-type semiconductor layer 117. The first electrode 133 and the second electrode 137 may include materials, e.g., silver (Ag), aluminum (Al), nickel (Ni), chromium (Cr), palladium (Pd), copper (Cu), platinum (Pt), tin (Sn), tungsten (W), gold (Au), rhodium (Rh), iridium (Ir), ruthenium (Ru), magnesium (Mg), zinc (Zn), and the like, and may have a single layer structure or a structure including two or more layers.

To efficiently distribute current, a contact layer 135 may be between the second conductivity-type semiconductor layer 117 and the second electrode 137. The contact layer 135 may include a transparent conductive oxide. The transparent conductive oxide may be at least one of elements selected from among indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), $In_4Sn_3O_{12}$, zinc magnesium oxide $(Zn_{(1-x)}Mg_xO$, 0≤x≤1), and the like.

FIGS. 4 to 11 illustrate cross-sectional diagrams of stages in a method of manufacturing a semiconductor light emitting device 10 according to an example embodiment.

Figure 4:
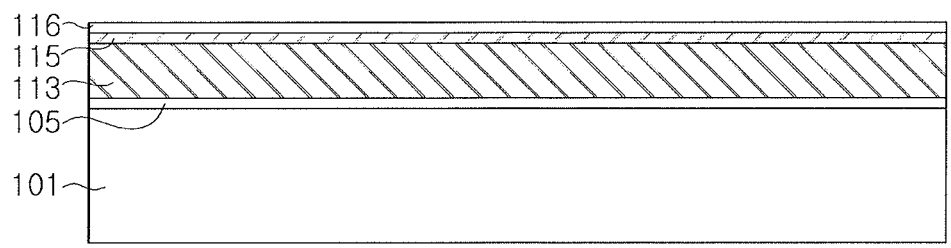
FIGS. 4 to 11 illustrate cross-sectional diagrams of stages in a method of manufacturing a semiconductor light emitting device according to an example embodiment.

Referring to FIG. 4, a buffer layer 105, a first conductivity-type semiconductor layer 113, an active layer 115, and a capping layer 116 may be formed in order on a substrate 101 using an epitaxial growth process.

Figure 5:
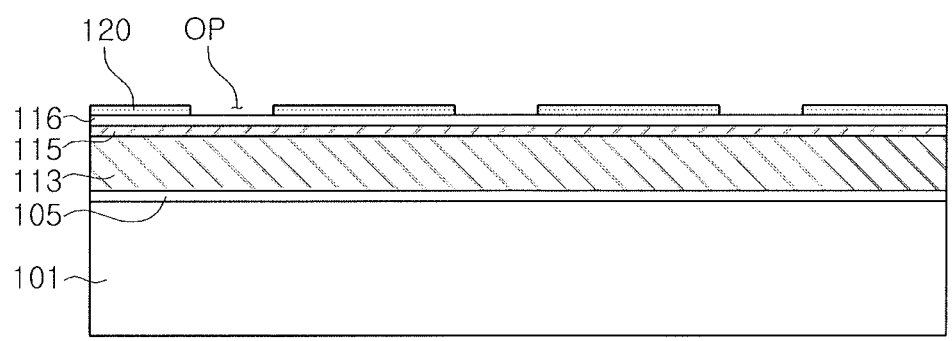

Referring to FIG. 5, a mask layer 120 including openings OP defining regions in which a second conductivity-type semiconductor layer 117 (see FIG. 6) may be formed on the capping layer 116. The capping layer 116 may be exposed through the openings OP. The mask layer 120 may include an amorphous material. For example, the mask layer 120 may include $SiN_x$, $SiO_2$, $TiN_x$, $ScN_x$, and the like. The mask layer 120 may be formed in-situ without being externally exposed after the capping layer 116 is formed. The mask layer 120 and the openings OP may be formed through processes which may significantly reduce a plasma damage of the capping layer 116. The mask layer 120 may be formed through an atomic layer deposition process. The openings OP of the mask layer 120 may be formed through a wet etching process. The openings OP may be spaced apart from one another along horizontal directions parallel to the upper surface of the substrate 101, e.g., the first direction (e.g., X direction) and the second direction (e.g., Y direction).

In example embodiments, when the capping layer 116 is not formed, the mask layer 120 may be formed on the active layer 115 including openings OP that expose the active layer 115.

Figure 6:
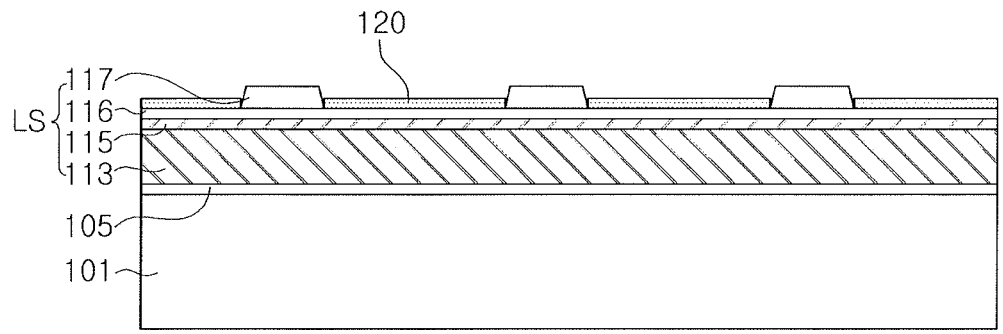

Referring to FIG. 6, second conductivity-type semiconductor layers 117 may be grown from a capping layer 116 exposed through openings OP of the mask layer 120 through a selective epitaxial growth process. The second conductivity-type semiconductor layers 117 may be spaced apart from each other in a horizontal direction parallel to an upper surface of the substrate 101. Through the above-described process, a light emitting structure LS including first conductivity-type semiconductor layers 113, the active layer 115, the capping layer 116, and the second conductivity-type semiconductor layer 117 may be formed.

Figure 7:
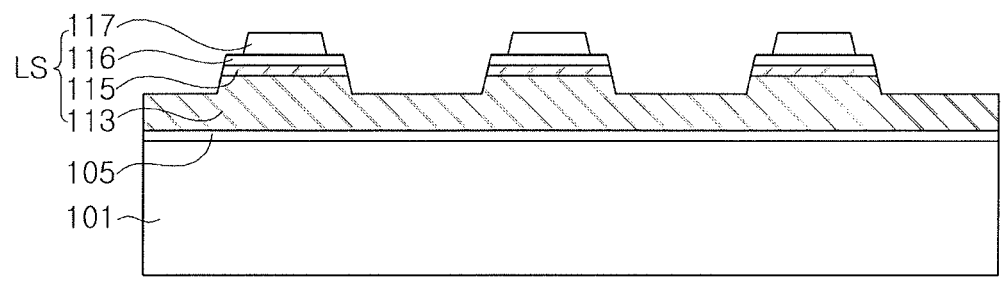

Referring to FIG. 7, after removing the mask layer 120, a portion of the capping layer 116 and a portion of an active layer 115 may be removed, e.g., using a dry etching process, to expose a portion of the first conductivity-type semiconductor layer 113 of the light emitting structure LS. In particular, a portion of a capping layer 116 and a portion of the active layer 115 that does not overlap the second conductivity-type semiconductor layer 117 along a third direction (e.g., Z direction) may be removed, while some of the capping layer 116 and the active layer 115 that does not overlap the second conductivity-type semiconductor layer 117 may remain, e.g., portions closest to the second conductivity-type semiconductor layer 117. In this process, a portion of the first conductivity-type semiconductor layer 113 along a vertical direction, i.e., the third direction (e.g., Z direction) may also be removed, while leaving some depth or thickness of the first conductivity-type semiconductor layer 113 on the substrate 101. A plurality of mesa structures may be formed the through the removal process.

Figure 8:
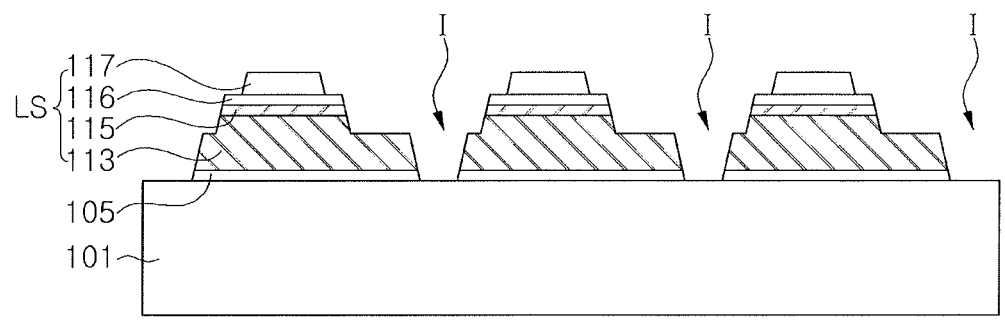

Referring to FIG. 8, isolation regions I isolating light emitting structures LS as individual chip units may be formed. The isolation regions I may be formed using a blade, a dry etching process, and the like. Any process in which the first conductivity-type semiconductor layer 113 and the buffer layer 105 may be cut without cutting the substrate 101, e.g., exposing an upper surface of the substrate 101, may be used. In particular, a portion of a portion of the first conductivity-type semiconductor layer 113 of the active layer 115 the third direction (e.g., Z direction) may be removed, while some of the capping layer 116 and the active layer 115 that does not overlap the second conductivity-type semiconductor layer 117 may remain. Through the above-described process, the light emitting structure LS isolated as individual chip units may be on the substrate 101.

Figure 9:
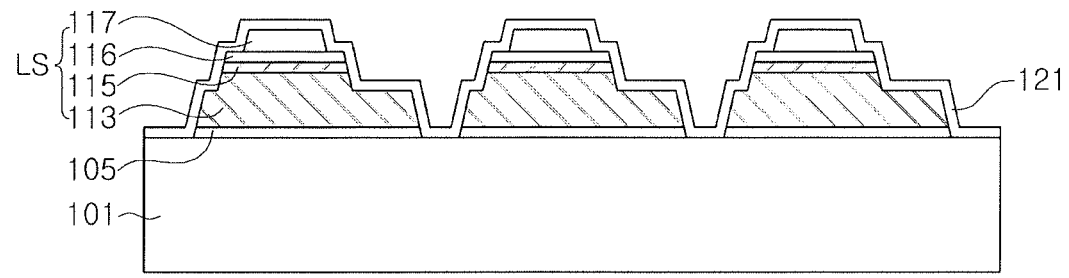

Referring to FIG. 9, an insulating layer 121 may cover light emitting structures LS isolated as individual chip units and the substrate 101. The insulating layer 121 may include an insulating material, e.g., $SiO_2$, $SiO_xN_y$, $Si_xN_y$, and the like.

Figure 10:
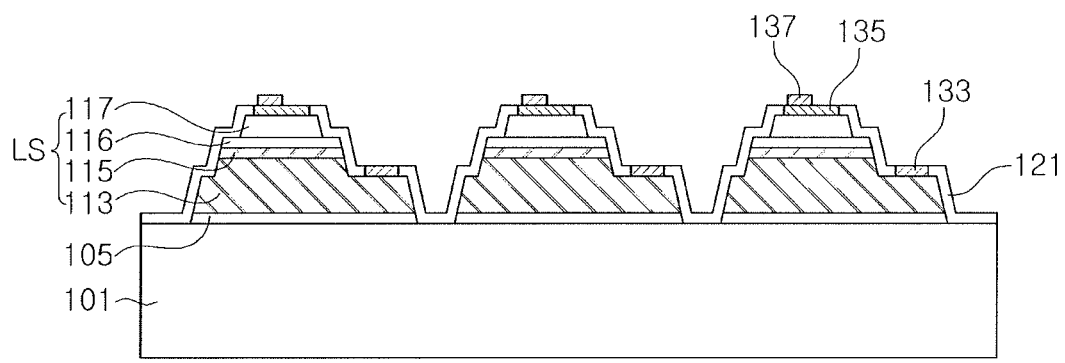

Referring to FIG. 10, a portion of the insulating layer 121 may be removed to expose the first conductivity-type semiconductor layer 113 and the second conductivity-type semiconductor layer 117. The first electrode 133 may be formed on the first conductivity-type semiconductor layer 113, and a contact layer 135 and a second electrode 137 may be formed on the second conductivity-type semiconductor layer 117.

Figure 11:
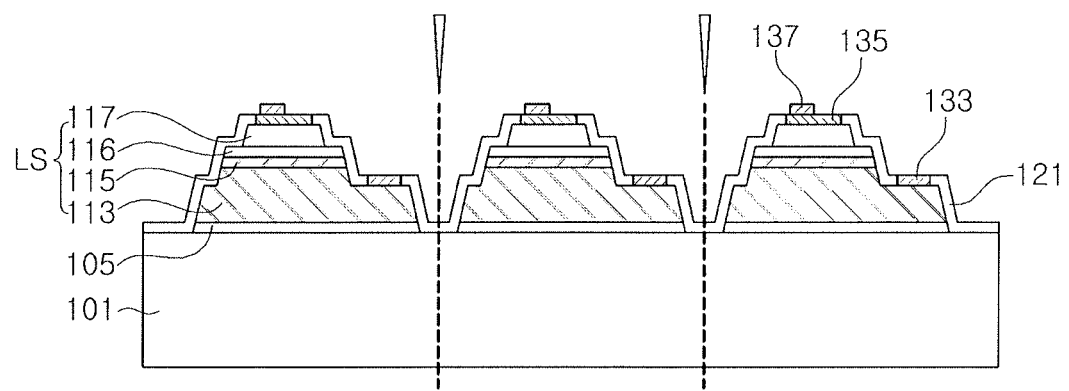

Referring to FIG. 11, a process of cutting the light emitting structures LS and a substrate 101 into individual chips may be performed. The cutting process may be performed using a blade, a dry etching process, and the like.

Figure 12:
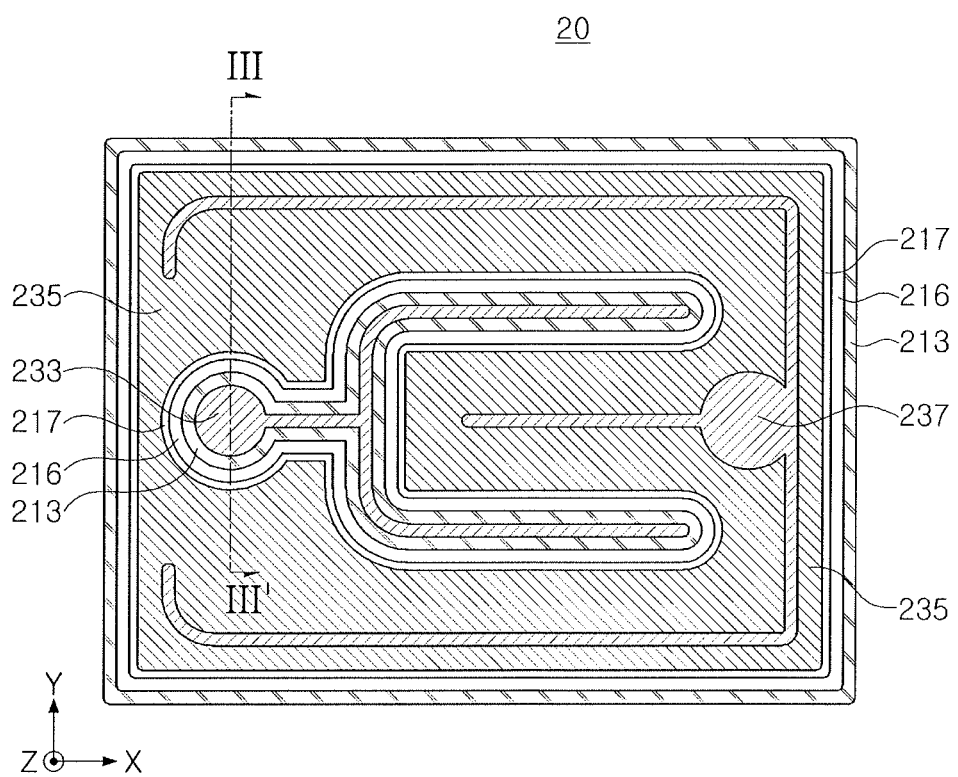
FIG. 12 illustrates a plan diagram of a semiconductor light emitting device according to an example embodiment.
Figure 13:
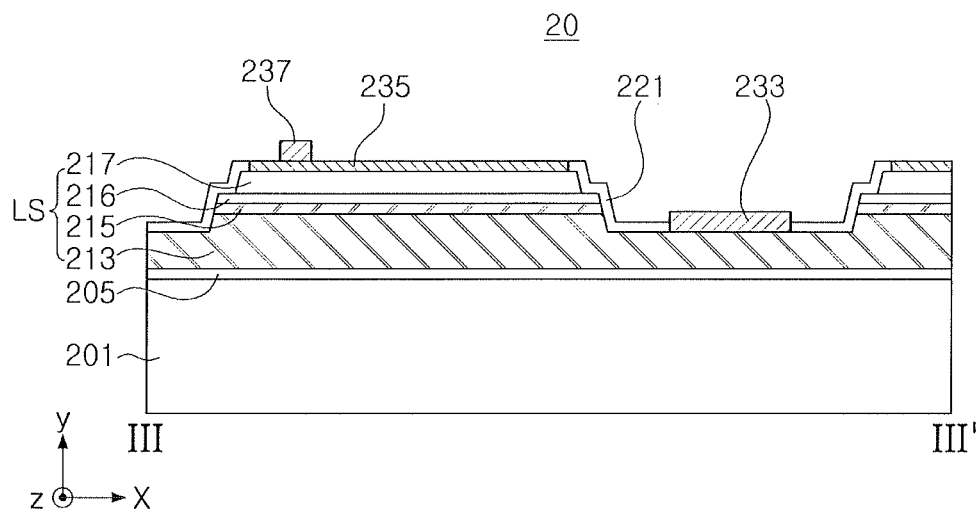
FIG. 13 illustrates a cross-sectional diagram taken along line in FIG. 12.

FIG. 12 is a schematic plan diagram illustrating a semiconductor light emitting device (20) according to an example embodiment. FIG. 13 is a cross-sectional diagram taken along line in FIG. 12.

Referring to FIGS. 12 and 13, a semiconductor light emitting device 20 in the example embodiment may include a light emitting structure LS on a substrate 201. The light emitting structure LS may include a first conductivity-type semiconductor layer 213, an active layer 215, a capping layer 216, and a second conductivity-type semiconductor layer 217. First and second electrodes 233 and 237 may be on the first and second conductivity-type semiconductor layers 213 and 217, respectively. To efficiently distribute current, the first and second electrodes 233 and 237 each may include a pad portion and at least one finger portion extending from the pad portion. Also, to efficiently distribute current, a contact layer 235 may further be disposed between the second conductivity-type semiconductor layer 217 and the second electrode 237. The semiconductor light emitting device 20 may have a size of several to several hundreds of microns.

The semiconductor light emitting device 20 may include a mesa structure formed by etching a portion of the capping layer 216 and a portion of the active layer 215 to expose the first conductivity-type semiconductor layer 213. The second conductivity-type semiconductor layer 217 may be in a portion of the capping layer 216 of the mesa structure. A portion of the first conductivity-type semiconductor layer 213 may be exposed in a peripheral region of the mesa structure. In FIG. 12, the first conductivity-type semiconductor layer 213 exposed through the etching process for forming the mesa structure may be disposed in a central portion and an outermost edge of the semiconductor light emitting device 20. An upper surface of the first conductivity-type semiconductor layer 213 exposed from the central portion of the semiconductor light emitting device 20 may be provided as a region in which the first electrode 233 may be disposed.

The first conductivity-type semiconductor layer 213, the active layer 215, the capping layer 216, and the second conductivity-type semiconductor layer 217 each may be formed of a material the same as materials of the first conductivity-type semiconductor layer 113, the active layer 115, the capping layer 116, and the second conductivity-type semiconductor layer 117.

The active layer 215 may be on a portion of the first conductivity-type semiconductor layer 213.

The second conductivity-type semiconductor layer 217 may be on a portion of the capping layer 216. The capping layer 216 may cover an overall upper surface of the active layer 215, and sidewalls of the capping layer 216 may be coplanar with sidewalls of the active layer 215. Thus, the second conductivity-type semiconductor layer 217 may be on a portion of the active layer 215. Sidewalls of the second conductivity-type semiconductor layer 217 may be spaced apart from sidewalls of the active layer 215 and sidewalls of the capping layer 216. Widths of the second conductivity-type semiconductor layer 217 taken in a first direction (e.g., X direction) and a second direction (e.g., Y direction) may be smaller than widths of the capping layer 216 and widths of the active layer 215. For example, widths of a lower surface of the second conductivity-type semiconductor layer 217 taken in the first direction (e.g., X direction) and the second direction (e.g., Y direction) may be smaller than widths of an upper surface of the capping layer 216 and widths of an upper surface of the active layer 215. A surface area of the second conductivity-type semiconductor layer 217 may be smaller than a surface area of the capping layer 216 and an area of the active layer 215. For example, the surface area of a lower surface of the second conductivity-type semiconductor layer 217 may be smaller than the surface area of an upper surface of the capping layer 216 and the surface area of an upper surface of the active layer 215.

As described above, by distancing sidewalls of the second conductivity-type semiconductor layer 217 from sidewalls of the active layer 215, which may a cause of non-luminous coupling, and by configuring an area of the second conductivity-type semiconductor layer 217 to be smaller than an area of the active layer 215, current density may increase and a light emitting efficiency may improve even when the semiconductor light emitting device 20 operates at low voltage.

Figure 14:
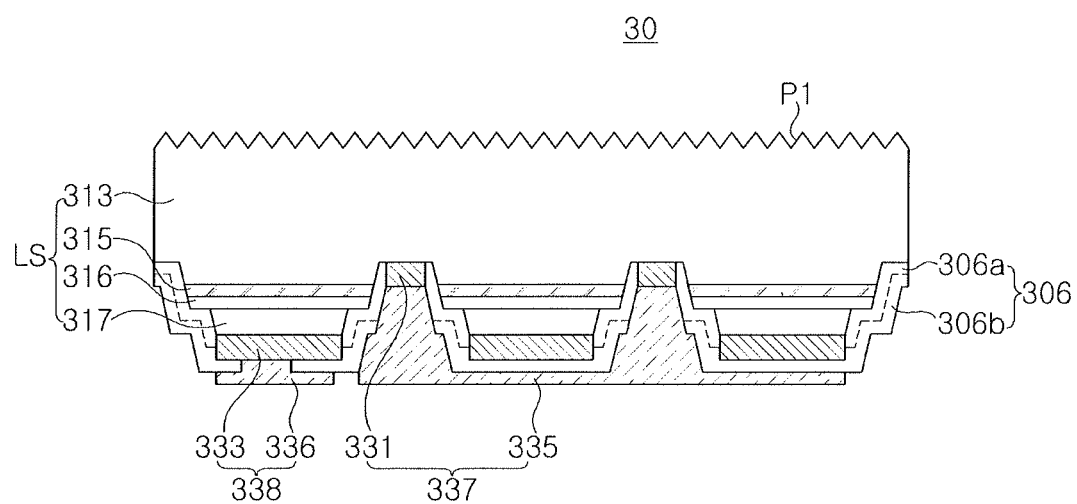
FIG. 14 illustrates a cross-sectional diagram of a semiconductor light emitting device according to an example embodiment.

FIG. 14 is a schematic cross-sectional diagram illustrating a semiconductor light emitting device according to an example embodiment. Referring to FIG. 14, a semiconductor light emitting device 30 in the example embodiment may include a light emitting structure LS in which a first conductivity-type semiconductor layer 313, an active layer 315, a capping layer 316, and a second conductivity-type semiconductor layer 317 are disposed in order. Also, the semiconductor light emitting device 30 may further include a first electrode structure 337 connected to the first conductivity-type semiconductor layer 313, and a second electrode structure 338 connected to the second conductivity-type semiconductor layer 317. The semiconductor light emitting device 30 may have a size of several to several hundreds of μm.

The first conductivity-type semiconductor layer 313, the active layer 315, the capping layer 316, and the second conductivity-type semiconductor layer 317 each may be formed of a material the same as materials of the first conductivity-type semiconductor layer 113, the active layer 115, the capping layer 116, and the second conductivity-type semiconductor layer 117 illustrated in FIGS. 1 to 3.

The active layer 315 may cover a portion of the first conductivity-type semiconductor layer 313.

The second conductivity-type semiconductor layer 317 may cover a portion of the capping layer 316. The capping layer 316 may cover an overall upper surface of the active layer 315, and sidewalls of the capping layer 316 may be coplanar with sidewalls of the active layer 315. Thus, the second conductivity-type semiconductor layer 317 may cover a portion of the active layer 315. Sidewalls of the second conductivity-type semiconductor layer 317 may be spaced apart from sidewalls of the active layer 315 and sidewalls of the capping layer 316. Widths of the second conductivity-type semiconductor layer 317 taken in a first direction (e.g., X direction) and a second direction (e.g., Y direction) may be smaller than widths of the capping layer 316 and widths of the active layer 315. An area of the second conductivity-type semiconductor layer 317 may be smaller than an area of the capping layer 316 and an area of the active layer 315.

As described above, by distancing sidewalls of the second conductivity-type semiconductor layer 317 from sidewalls of the active layer 315, which may a cause of non-luminous coupling, and by configuring an area of the second conductivity-type semiconductor layer 317 to be smaller than an area of the active layer 315, current density may increase and a light emitting efficiency may improve even when the semiconductor light emitting device 30 operates at low voltage.

The first electrode structure 337 may be connected to the first conductivity-type semiconductor layer 313 through the second conductivity-type semiconductor layer 317, the capping layer 316, and the active layer 315. The first electrode structure 337 may include a first contact electrode 331 in contact, e.g., direct contact, with the first conductivity-type semiconductor layer 313 and a first pad electrode 335 connected to the first contact electrode 331. A plurality of the first contact electrodes 331 may be disposed to reduce contact resistance with the first conductivity-type semiconductor layer 313 and to distribute current of the semiconductor light emitting device 30. The number of the first contact electrodes 331 may not be limited to the example illustrated in FIG. 14. The second electrode structure 338 may include a second contact electrode 333 in contact, e.g., direct contact, with the second conductivity-type semiconductor layer 317 and a second pad electrode 336 connected to the second contact electrode 333.

The first contact electrode 331 may include a material forming an ohmic contact with the first conductivity-type semiconductor layer 313. The first contact electrode 331 may include materials, e.g., Ag, Ni, Al, Rh, Pd, Ir, Ru, Mg, Zn, Pt, Au, and the like, and may have a single layer structure or a structure having two or more layers. For example, the first contact electrode 331 may include Cr/Au or Cr/Au/Pt. The second contact electrode 333 may include a material forming an ohmic contact with the second conductivity-type semiconductor layer 317. For example, the second contact electrode 333 may include Ag or Ag/Ni. The first and second pad electrodes 335 and 336 may include materials, e.g., Ag, Ni, Al, Rh, Pd, Ir, Ru, Mg, Zn, Pt, Au, and the like, and may have a single layer structure or a structure having two or more layers.

The first electrode structure 337 and the second electrode structure 338 may be electrically isolated from each other by a passivation layer 306. The passivation layer 306 may include a first insulating layer 306a and a second insulating layer 306b, and the first and second insulating layers 306a and 306b may be formed of $SiO_2$, SiN, or SiON.

A serrated structure P1 may be formed on a surface of the first conductivity-type semiconductor layer 313, e.g., surface opposite the active layer 315. The serrated structure P1 may have a hemispherical shape, a conical shape, a polypyramidal shape, and the like.

FIGS. 15 to 22 illustrate stages in method of making a semiconductor light emitting device according to an example embodiment. In the description of the method of manufacturing a semiconductor light emitting device 30 with reference to FIGS. 15 to 22 below, a region corresponding to a single semiconductor light emitting device, i.e., an individual chip region, will be described.

Figure 15:
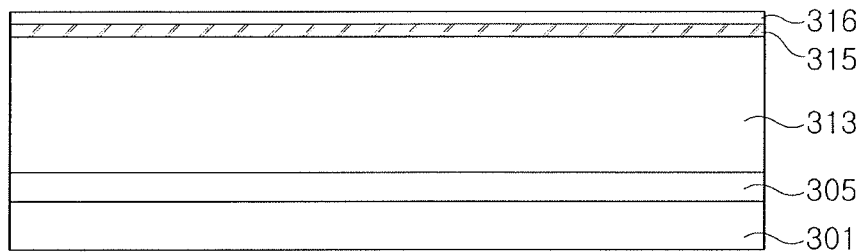
FIGS. 15 to 22 illustrate cross-sectional diagrams of a semiconductor light emitting device according to an example embodiment.
Figure 16:
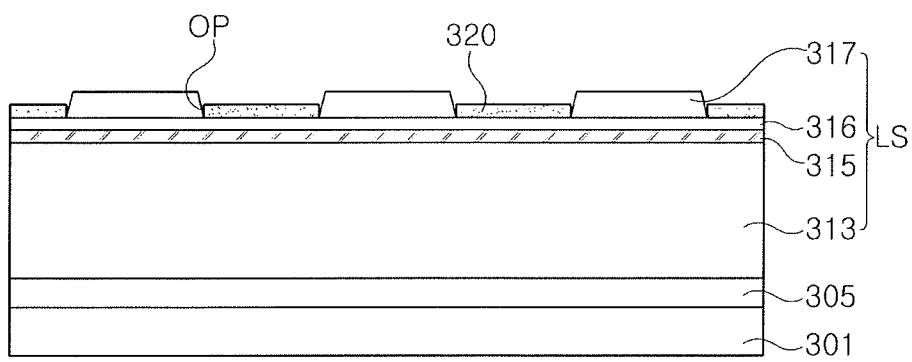

Referring to FIG. 15, a buffer layer 305, a first conductivity-type semiconductor layer 313, an active layer 315, and a capping layer 316 will be formed in that order on a substrate 301, e.g., using an epitaxial growth process Referring to FIG. 16, a mask layer 320 including openings OP defining regions in which the second conductivity-type semiconductor layer 317 may be formed is provided on the capping layer 316. The capping layer 316 may be exposed through the openings OP. The mask layer 320 may include an amorphous material, e.g., $SiN_x$, $SiO_2$, $TiN_x$, $ScN_x$, and the like. The mask layer 320 may be formed in in-situ without being externally exposed after the capping layer 316 is formed. The mask layer 320 and the openings OP may be formed through processes which may significantly reduce plasma damage to the capping layer 316. The mask layer 320 may be formed through an atomic layer deposition process. The openings OP of the mask layer 120 may be formed through a wet etching process. In an implementation, when the capping layer 316 is not formed, the mask layer 320 may be formed on the active layer 315. The second conductivity-type semiconductor layer 317 may be grown from the capping layer 316 exposed through the openings OP of the mask layer 320 through a selective epitaxial growth process. Through the above-described process, a light emitting structure LS including the first conductivity-type semiconductor layer 313, the active layer 315, the capping layer 316, and the second conductivity-type semiconductor layer 317 may be formed.

Figure 17:
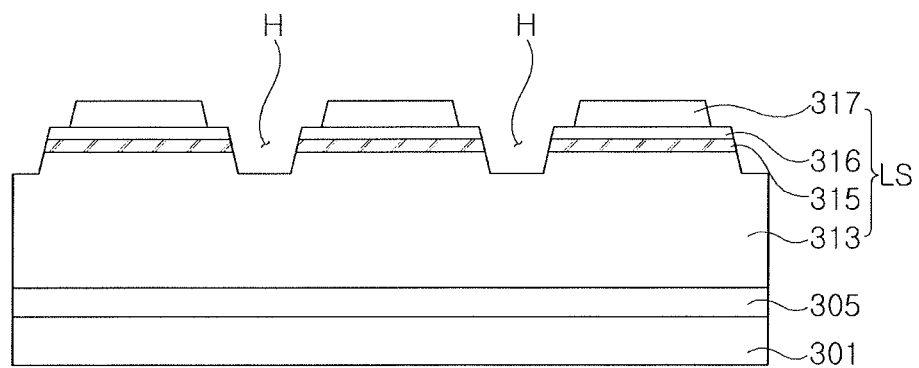

Referring to FIG. 17, after removing the mask layer 320, a portion of a capping layer 316 and a portion of an active layer 315 may be removed, e.g., using a dry etching process, to expose a portion of the first conductivity-type semiconductor layer 313 of a light emitting structure LS. In this process, a portion of the first conductivity-type semiconductor layer 313 may also be removed, thus forming a mesa structure in each of individual chip regions.

Along with the formation of the mesa structure, holes H penetrating through the capping layer 316, the active layer 315, and the first conductivity-type semiconductor layer 313 may be formed, and the first conductivity-type semiconductor layer 313 may be partially exposed through the holes H. The holes H may be a structure for forming an electrode connected to the first conductivity-type semiconductor layer 313. A portion of the first conductivity-type semiconductor layer 313 exposed through the holes H may be provided as a region in which the first contact electrodes 331 are disposed.

Figure 18:
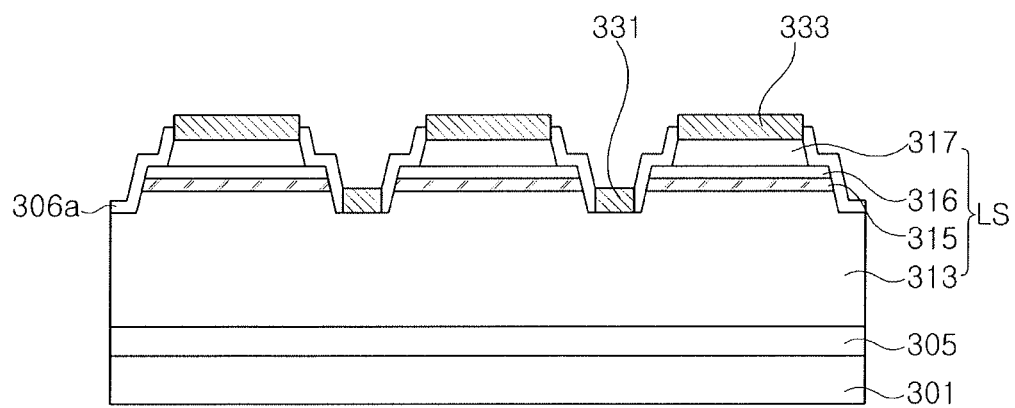

Referring to FIG. 18, a first contact electrode 331 may be formed on a first conductivity-type semiconductor layer 313, and a second contact electrode 333 may be formed on a second conductivity-type semiconductor layer 317.

A first insulating layer 306a covering a light emitting structure LS and a substrate 301 may be formed. A portion of the first insulating layer 306a may be removed, and a first contact electrode 331 and a second contact electrode 333 may be disposed. The first contact electrode 331 and the second contact electrode 333 may be electrically isolated from each other by the first insulating layer 306a.

The first insulating layer 306a may include an insulating material, e.g., $SiO_2$, $SiO_xN_y$, $Si_xN_y$, and the like. The first contact electrode 331 may include a material forming an ohmic contact with the first conductivity-type semiconductor layer 313. An example embodiment of the first contact electrode 331 is not limited thereto. The first contact electrode 331 may include a material, e.g., Ag, Ni, Al, Rh, Pd, Ir, Ru, Mg, Zn, Pt, Au, and the like, and may have a single layer structure or a structure having two or more layers. For example, the first contact electrode 331 may include Cr/Au or Cr/Au/Pt. A barrier layer may further be disposed on the first contact electrode 331. The barrier layer may be formed of at least one of elements selected from Ni, Al, Cu, Cr, Ti, combinations thereof, and the like. The second contact electrode 333 may include a material forming an ohmic contact with the second conductivity-type semiconductor layer 317. For example, the second contact electrode 333 may include Ag or Ag/Ni. A barrier layer may further be disposed on the second contact electrode 333. The barrier may be formed of at least one of elements selected from a group consisting of Ni, Al, Cu, Cr, Ti, and combinations thereof.

Figure 19:
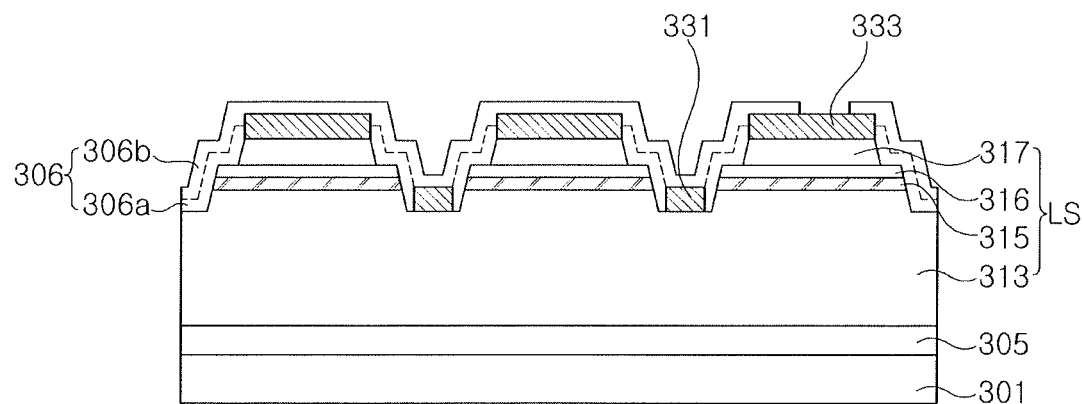

Referring to FIG. 19, a second insulating layer 306b covering the first insulating layer 306a, the first contact electrode 331, and the second contact electrode 333 may be formed.

The second insulating layer 306b may be provided as a passivation layer 306 along with the first insulating layer 306a. An example embodiment of the second insulating layer 306b may not be limited thereto, and the second insulating layer 306b may be formed of a material similar to or the same as a material of the first insulating layer 306a.

Figure 20:
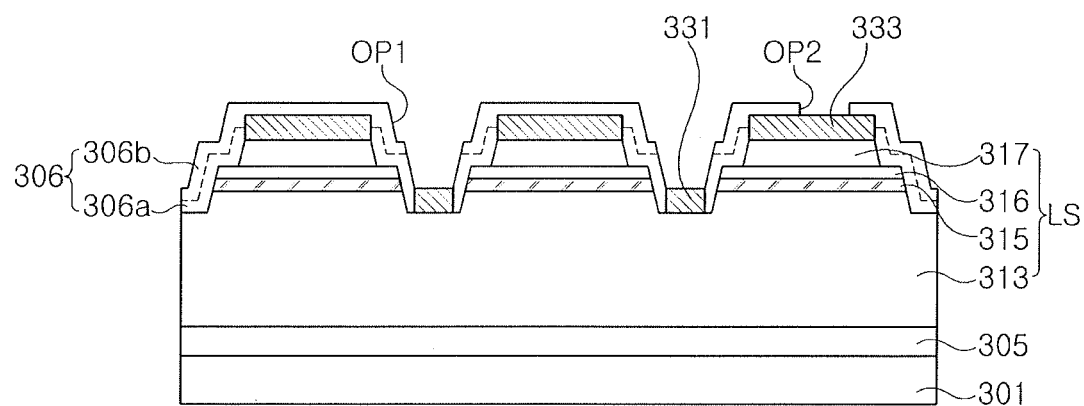

Referring to FIG. 20, first and second openings OP1 and OP2 exposing first and second contact electrodes 331 and 333 may be formed on the second insulating layer 306b.

Figure 21:
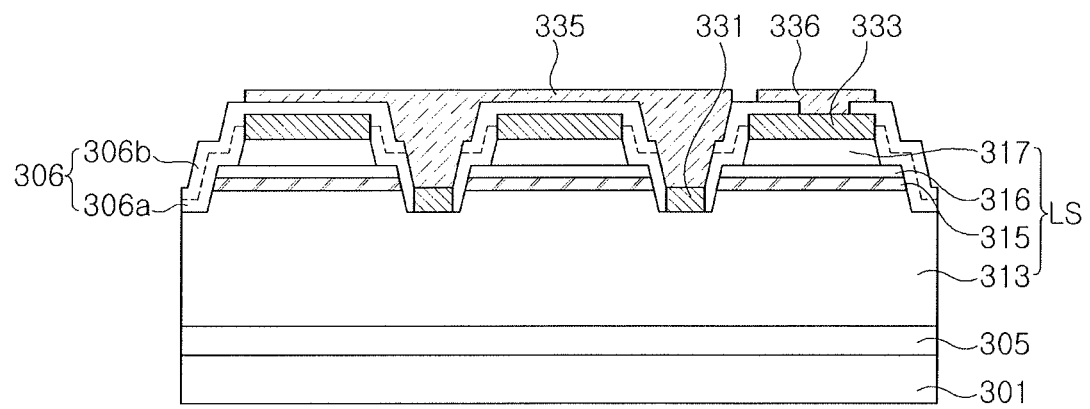

Referring to FIG. 21, first and second pad electrodes 335 and 336 filling first and second openings OP1 and OP2 may be formed.

The first pad electrode 335 may be connected to a first contact electrode 331 through the first openings OP1, and the second pad electrode 336 may be connected to a second contact electrode 333 through the second opening OP2. The first pad electrode 335 and the second pad electrode 336 may be spaced apart from each other with a certain gap in a horizontal direction in parallel to an upper surface of the substrate 301.

The first and second pad electrodes 335 and 336 may include a material such as Ag, Ni, Al, Rh, Pd, Ir, Ru, Mg, Zn, Pt, Au, and the like, and may have a single layer structure or a multilayer structure.

Figure 22:
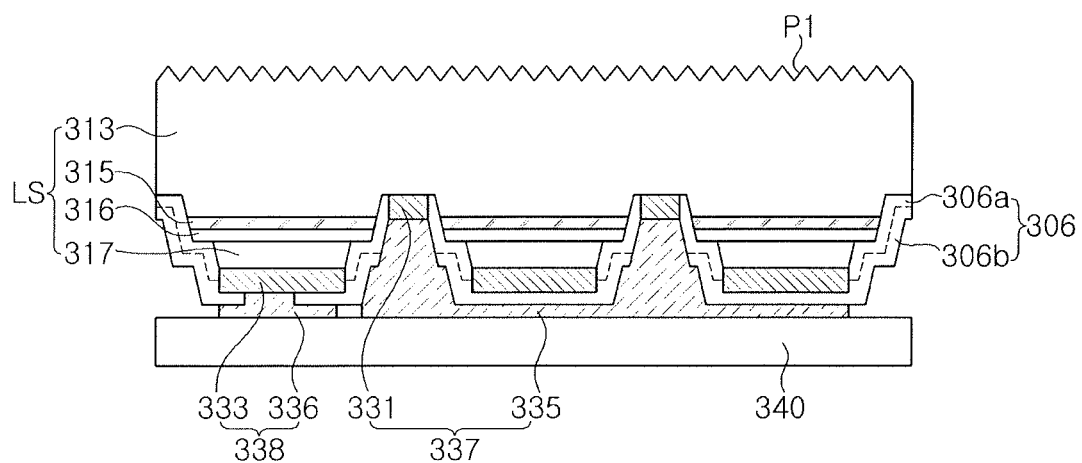

Referring to FIG. 22, a substrate 301 may be removed, and a serrated structure P1 may be formed on a surface of the first conductivity-type semiconductor layer 313. When the substrate 301 is removed, the buffer layer 305 may also be removed.

A process of temporality attaching a support substrate 340 to first and second pad electrodes 335 and 336 may be performed. When the support substrate 340 is attached, an adhesive material such as infrared thermosetting material may be used. The substrate 301 may be removed through a process such as a laser lift-off process. The process is not limited to the above-described example, and the substrate 301 may also be removed through a different mechanical or chemical process.

A serrated structure P1 may be formed on a surface of the first conductivity-type semiconductor layer 313. The serrated structure P1 may reduce total reflection on a surface of the first conductivity-type semiconductor layer 313 and may thus improve light extraction efficiency. The serrated structure P1 may be formed through a dry texturing process or a wet texturing process.

Referring back to FIG. 14, the support substrate 340 may be removed, and a semiconductor light emitting device 30 may be manufactured. For example, the semiconductor light emitting device 30 may be manufactured through processes of attaching the light emitting structures LS illustrated in FIG. 22 to an adhesive tape, removing the support substrate 340, and cutting the light emitting structures LS into individual chips.

According to the aforementioned example embodiments, the semiconductor light emitting device may operate with low current and may have improved light emitting efficiency.

Also, according to the aforementioned example embodiments, by using the method of manufacturing the semiconductor light emitting device described above, a semiconductor light emitting device which may operate in low current and may have improved light emitting efficiency may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor light emitting device, the method comprising:
    forming a first conductivity-type semiconductor layer on a substrate;
    forming an active layer on the first conductivity-type semiconductor layer;
    forming a mask layer having an opening on the active layer;
    growing a second conductivity-type semiconductor layer through the opening;
    removing the mask layer;
    removing a portion of the active layer and a portion of the first conductivity-type semiconductor layer that do not overlap the second conductivity-type semiconductor layer; and
    removing a portion of the first conductivity-type semiconductor layer to expose the substrate.

2. The method as claimed in claim 1, further comprising forming a capping layer on the active layer before the forming the mask layer having an opening on the active layer,
    wherein the second conductivity-type semiconductor layer is formed on the capping layer through the opening.

3. The method as claimed in claim 2, wherein the second conductivity-type semiconductor layer is grown through a selective epitaxial growth process from the capping layer through the opening.

4. The method as claimed in claim 2, wherein removing a portion of the active layer and a portion of the first conductivity-type semiconductor layer includes etching until an area of a lower surface of the second conductivity-type semiconductor layer is smaller than an area of an upper surface of the capping layer.

5. The method as claimed in claim 2, wherein an energy band gap of the capping layer is greater than an energy band gap of the active layer.

6. The method as claimed in claim 1, wherein an area of the opening is smaller than an area of the active layer.

7. The method as claimed in claim 1, wherein forming the mask layer includes performing an atomic layer deposition process.

8. The method as claimed in claim 1, wherein the mask layer is formed of an amorphous material.

9. The method as claimed in claim 1, wherein the opening is formed through a wet etching process.

10. The method as claimed in claim 1, wherein removing the mask layer includes performing a wet etching process.

11. The method as claimed in claim 1, wherein removing a portion of the active layer and a portion of the first conductivity-type semiconductor layer includes performing a wet etching process.

12. A method of manufacturing a semiconductor light emitting device, the method comprising:
    forming a first conductivity-type semiconductor layer and an active layer in order on a substrate;
    forming a mask layer having openings on the active layer;
    forming a light emitting structure including the first conductivity-type semiconductor layer, the active layer, and a second conductivity-type semiconductor layer by growing the second conductivity-type semiconductor layer on the active layer through the openings;
    removing the mask layer;
    forming mesa structures by removing a portion of the active layer and a portion of the first conductivity-type semiconductor layer of the light emitting structure;
    separating the light emitting structure into individual chip units by removing a portion of the first conductivity-type semiconductor layer to expose the substrate; and
    cutting the substrate into individual chip units.

13. The method as claimed in claim 12, further comprising forming a capping layer on the active layer prior to forming the mask layer having openings on the active layer,
    wherein forming the light emitting structure includes growing the second conductivity-type semiconductor layer through a selective epitaxial growth process from the capping layer through the openings.

14. The method as claimed in claim 12, further comprising, after forming the mask layer:
    forming an insulating layer covering the light emitting structure and the substrate;
    exposing the first and second conductivity-type semiconductor layers by removing a portion of the insulating layer; and
    forming first and second contact electrodes on the first and second conductivity-type semiconductor layers exposed through the portion of the insulating layer, respectively.

15. The method as claimed in claim 14, wherein the insulating layer is in direct contact with the substrate.

16. The method as claimed in claim 14, further comprising forming first and second electrodes on the first and second contact electrodes, respectively, after forming first and second contact electrodes.

17. The method as claimed in claim 12, wherein, in each of the mesa structures, an area of the second conductivity-type semiconductor layer is smaller than an area of the active layer.

18. The method as claimed in claim 12, further comprising forming a buffer layer on the substrate, prior to forming the first conductivity-type semiconductor layer.

19. The method as claimed in claim 18, wherein separating the light emitting structure into individual chip units includes removing the buffer layer.

20. The method as claimed in claim 12, wherein:
    the openings are formed through a wet etching process, and
    the mesa structures are formed through a dry etching process.

* * * * *